United States Patent [19]
Hagihara et al.

[11] Patent Number: 4,920,026
[45] Date of Patent: Apr. 24, 1990

[54] IMAGE FORMATION METHOD AND APPARATUS USING LIGHT AND PRESSURE SENSITIVE SHEETS

[75] Inventors: Hideaki Hagihara; Iwakazu Honda, both of Nara, Japan

[73] Assignee: Sharp Kabushiki Kaisha, Osaka, Japan

[21] Appl. No.: 218,577

[22] Filed: Jul. 12, 1988

[30] Foreign Application Priority Data

Jul. 17, 1987 [JP] Japan .................. 62-179805
Jul. 23, 1987 [JP] Japan .................. 62-184348

[51] Int. Cl.$^5$ .............................. G03C 1/72
[52] U.S. Cl. ..................... 430/138; 354/301
[58] Field of Search ............ 430/138; 354/301

[56] References Cited

U.S. PATENT DOCUMENTS 4,399,209 8/1983 Sanders et al. ............. 430/138
4,624,560 11/1986 Beery ........................ 430/138
4,816,873 3/1989 Hatta ......................... 430/138
4,826,751 5/1989 Hatta ......................... 430/138

Primary Examiner—Paul R. Michl
Assistant Examiner—Thomas R. Neville
Attorney, Agent, or Firm—Flehr, Hohbach, Test Albritton & Herbert

[57] ABSTRACT

A light-accepting sheet with a transparent colorless base sheet coated with microcapsules encapsulating a colorless dye and a photopolymerizing agent which hardens upon exposure to light and an image transfer sheet coated with a developing agent having a chromogenic effect on this colorless dye are superposed together before exposed to an image forming beam of light. The microcapsules are selectable hardened to form an invisible image which turns into a visible image when the superposed sheets are pressed together to rupture only those of the microcapsules which were not hardened. The light-accepting sheet and image transfer sheet may be superposed from the beginning to be stored and delivered to be exposed together as a combined light and pressure sensitive image formation sheet.

4 Claims, 4 Drawing Sheets

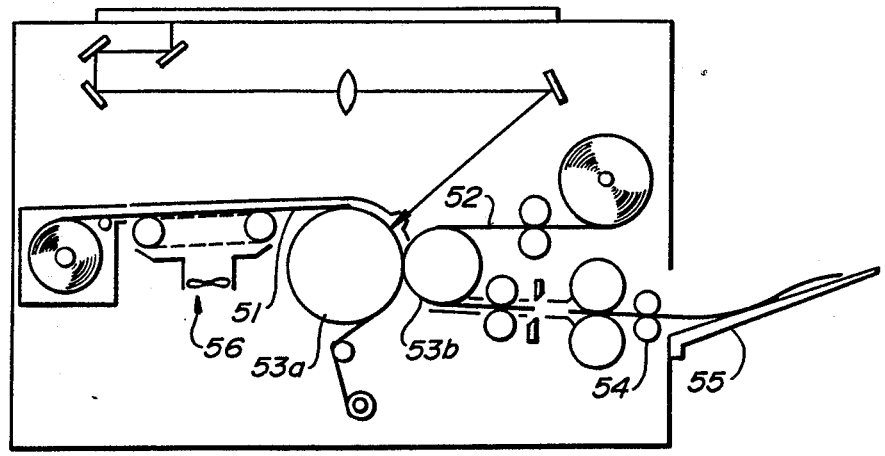
FIG._1 (PRIOR ART)
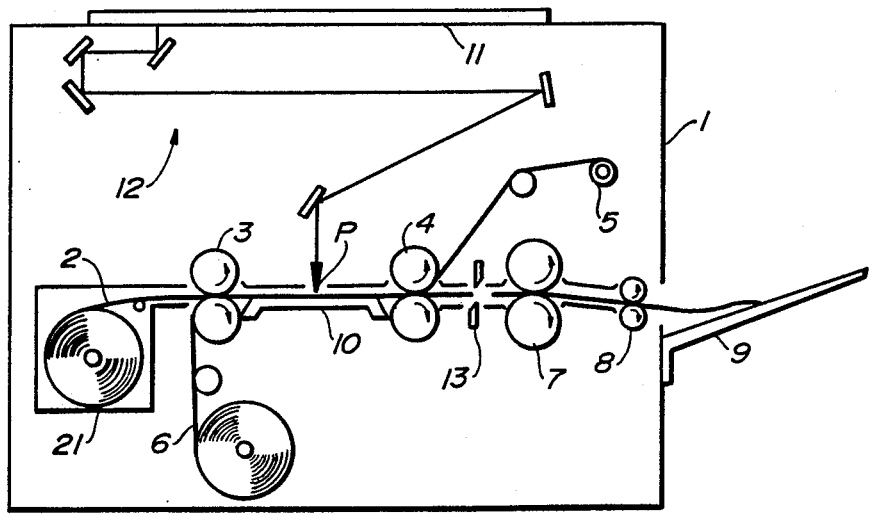
FIG._2

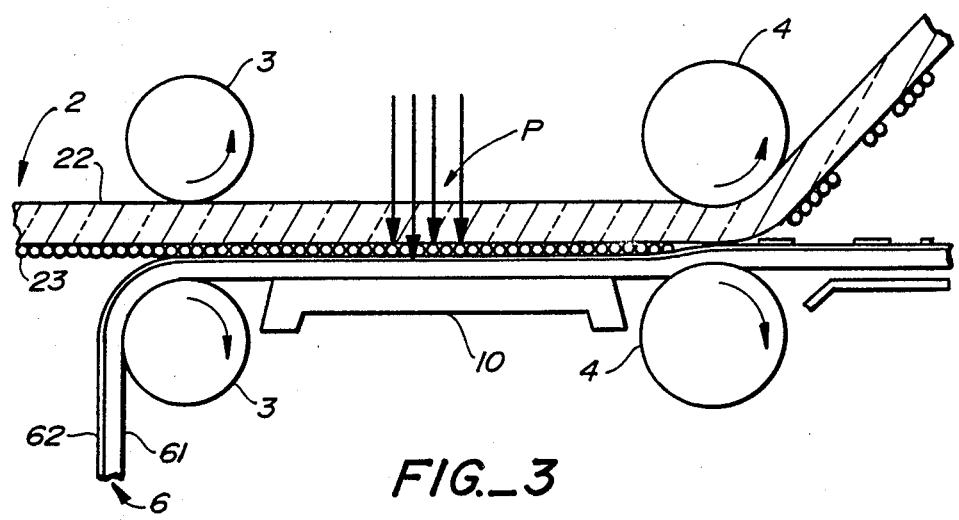
FIG._3
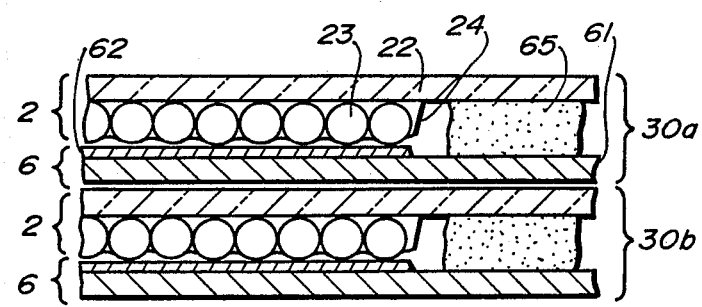
FIG._6

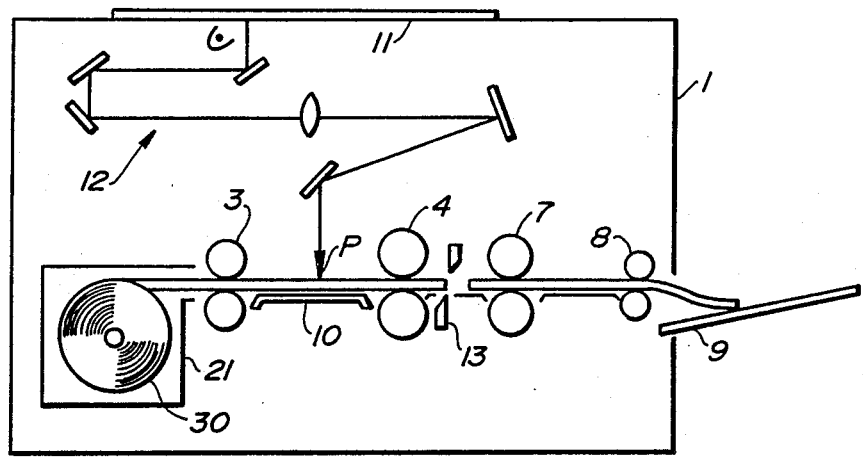
FIG._4
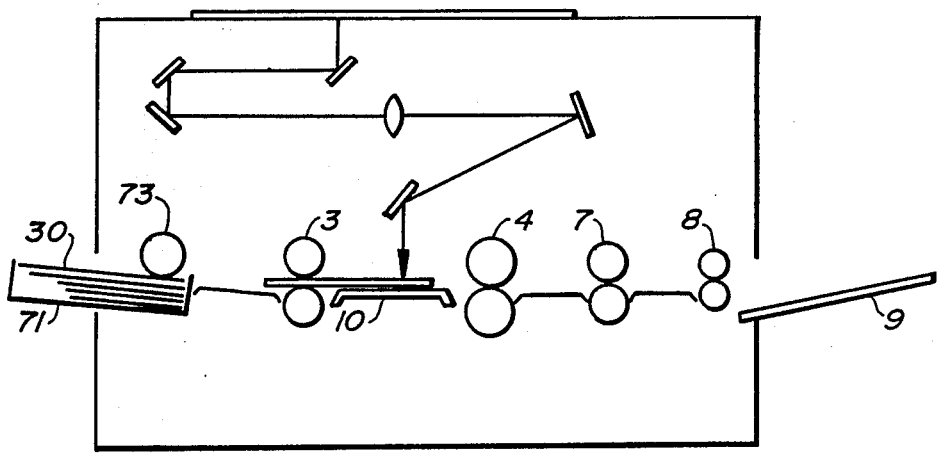
FIG._7

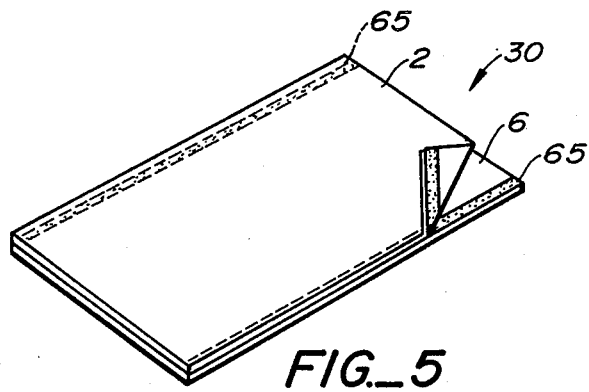
FIG._5
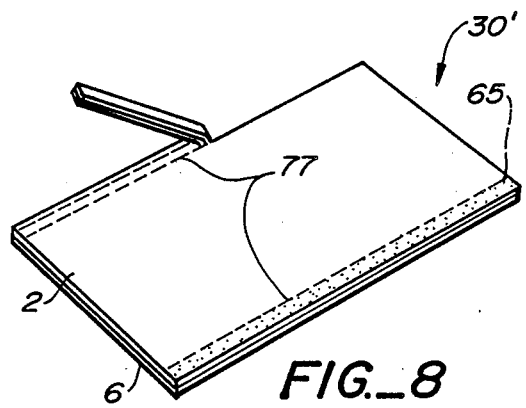
FIG._8
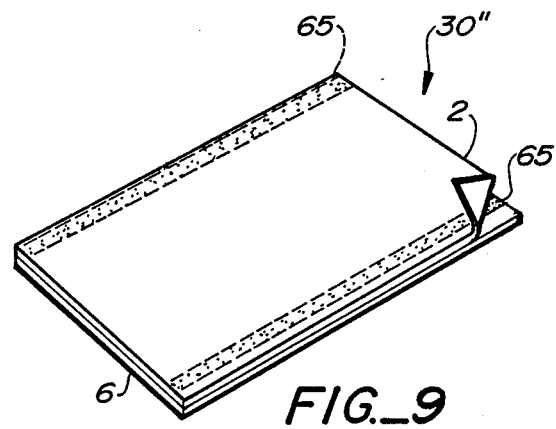
FIG._9

IMAGE FORMATION METHOD AND APPARATUS USING LIGHT AND PRESSURE SENSITIVE SHEETS

BACKGROUND OF THE INVENTION

This invention relates to an image formation method by chromogenic reaction in a light and pressure sensitive sheet comprised of a light-accepting sheet and an image transfer sheet, and more particularly to a method and apparatus for improved protection of microcapsules with which a surface of the light-accepting sheet is coated such that these microcapsules are not easily damaged.

Japanese Patent Publications Tokkai 58-88739 and 59-149343 have disclosed light and pressure sensitive image formation materials comprised of a light-accepting sheet with a base sheet coated with microcapsules encapsulating a colorless dye and a photopolymerizing agent and an image transfer sheet coated with a developing agent for chromogenic reaction of this colorless dye. As shown in FIG. 1, a prior art copier using such an image formation material is so structured that the microcapsule-coated surface of a light-accepting sheet 51 is exposed to light reflected from an original image to be copied to form thereon an invisible (latent) hardened image by selectively hardening those of the microcapsules exposed to light energy by the polymerization of the encapsulated photopolymerizing agent. An image transfer sheet 52, originally kept in the form of a roll, is thereafter superposed such that the hardened image formed on the light-accepting sheet 51 and the surface of the image transfer sheet 52 coated with the developing agent are directly in contact in face-to-face relationship with each other. As they are thereafter passed and pressed together between pressure applying rollers 53a and 53b, those of the microcapsules which were not hardened when the light-accepting sheet was exposed to light rupture, allowing the colorless dye, etc. encapsulated inside to flow out to react with the developing agent on the image transfer sheet 52 and forming a visible image thereon. After the formation of a visible image on the image transfer sheet 52, the light-accepting sheet is separated therefrom and the image transfer sheet 52 with a visible image thereon is discharged onto a discharge tray 55 by means of discharge rollers 54. Alternatively, this technology described above may be applied to a printer.

According to the technology described above including the step of superposing a light-accepting sheet and an image transfer sheet after the light-accepting sheet is exposed to light, however, the light-accepting sheet remains unprotected for a long period of time until the aforementioned superposition step is effected. Thus, the microcapsules on the surface of the light-accepting sheet are easily damaged and/or ruptured. In order to prevent such damage to the microcapsules, a complicated transportation system including a suction device 56 or the like is commonly provided to properly position the light-accepting sheet such that no external force is applied on its coated surface.

SUMMARY OF THE INVENTION

Broadly, it is an object of the present invention to provide an improved image formation method and apparatus using a light-accepting sheet with a base sheet coated with microcapsules containing a colorless dye and a photopolymerizing agent and an image transfer sheet coated with a developing agent having a chromogenic effect on this colorless dye.

More particularly, it is an object of the present invention to provide such an image formation method by which the microcapsule-coated surface of the light-accepting sheet is better protected and hence a complicated device for its protection is not required.

It is another object of the present invention to provide a container of these sheets for use in such an apparatus.

The above and other objects of the present invention can be achieved in part by using a transparent colorless material for the base of the light-accepting sheet such that the microcapsules can be exposed to light through such a base sheet. This makes it possible to superpose the image transfer sheet over the microcapsule-coated surface of the light-accepting sheet before, instead of after the light-accepting sheet is exposed to light. To further protect the microcapsules, the light-accepting sheet and the image transfer sheet may be already superposed one on top of the other from the beginning to form a single image formation sheet and together rolled up inside a case.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a schematic sectional view of a prior art copier to show its internal structure, FIG. 2 is a schematic sectional view of a copier using an image formation method embodying the present invention, FIG. 3 is an enlarged view of a portion of FIG. 2, FIG. 4 is a schematic sectional view of a copier using another image formation method embodying the present invention, FIG. 5 is a perspective view of a light and pressure sensitive image formation sheet embodying the present invention, FIG. 6 is a sectional view of a portion of the image formation sheet of FIG. 5 when rolled up as shown in FIG. 4, FIG. 7 is a schematic sectional view of a copier using single image formation sheets embodying the present invention, and FIGS. 8 and 9 are perspective views of other light and pressure sensitive image formation sheets embodying the present invention.

In all these figures, components which are substantially identical or at least similar to each other are indicated by the same numerals.

DETAILED DESCRIPTION OF THE INVENTION

In FIG. 2 which shows a copier using an image formation method embodying the present invention, numeral 1 indicates its housing and numeral 21 indicates a storage case in which a roll of light-accepting sheets 2 is stored with surface coated with microcapsules facing inward and protected against light and force from outside. Guide rollers 3 are disposed immediately outside the exit opening of the storage case 21 and one end of the light-accepting sheets 2 is passed between these guide rollers 3 and a pair of pressure applying rollers 4 and is wrapped around a take-up roller 5.

Near the storage case 21, a roll of image transfer sheets 6 is supported with the surface coated with a developing agent facing outward. One end of the image transfer sheets 6 is passed not only between the aforementioned pairs of guide rollers 3 and pressure applying rollers 4 but also between a pair of heat rollers 7 and is directed onto the discharge tray 9 by a pair of discharge rollers 8 such that the microcapsule-coated surface of the light-accepting sheets 2 and the developer-coated surface of the image transfer sheets 6 are superposed to each other in a face-to-face relationship between the guide rollers 3 and the pressure applying rollers 4. The guide rollers 3 may be made of a rubber material and their nipping pressure is small such that they can serve to correct the directions of motion of the light-accepting and image-transfer sheets and to prevent them from becoming wrinkled without causing the microcapsules on the light-accepting sheets 2 which pass therebetween to be ruptured. The pressure applying rollers 4, on the other hand, are intended to press the light-accepting and image transfer sheets together with a sufficient force such that those of the microcapsules not hardened by polymerization are ruptured.

Provided between the pairs of guide rollers 3 and pressure applying rollers 4 is a support table 10 which is formed with a metallic plate or the like and serves to support the light-accepting and image transfer sheets 2 and 6 as they pass between these rollers 3 and 4. At the top of the housing 1 is a document table 11. An optical unit 12 including a lamp and mirrors is disposed in the upper part of the housing 1 for scanning an original document placed on the document table 11 such that reflected light therefrom is focused at an exposure point P defined on the support table 10.

As shown more in detail in FIG. 3, the light-accepting sheets 2 are formed with a transparent colorless base sheet 22 of thickness between $(10 + \text{several})\mu m$ and $(\text{several tens})\mu m$ with microcapsules 23 coated on one surface thereof. The transparent colorless base sheet 22 may be formed with a light-transmissive polyester or polyethylene film. A binder is used for the coating of the microcapsules 23. The microcapsules comprise resin shells encapsulating a photopolymerizing agent and a colorless dye. If a pressure is applied on a microcapsule 23 before light is made incident thereupon, the resin shells rupture, allowing the encapsulated photopolymerizing agent and colorless dye to flow out. When the microcapsules 23 are exposed to light, however, the photopolymerizing agent polymerizes and hardens inside the shells, preventing the shells from rupturing even if a pressure is applied thereon.

The image transfer sheets 6 are formed with a base sheet of transfer paper 61 coated with a thermoplastic resin (not shown) such as the thermoplastic polymer pigment material disclosed in Japanese Patent Publication Tokkai 60-259490 and a developing agent 62 having a chromogenic effect on the colorless dye inside the microcapsules 23. The thermoplastic resin is provided because it becomes soft when heated and serves to add luster to the visible image transferred onto the transfer paper as will be explained below.

Inside the copier thus structured, a light-accepting sheet 2 pulled out of the storage case 21 is not only supported by the guide rollers 3 at its exit opening but also superposed on an image transfer sheet 6 in a face-to-face relationship at the same time. Because the image transfer sheet 6 is capable of absorbing externally applied force to a certain extent, it has an effect of protecting the microcapsules 23 on the light-accepting sheet 22 from injury. The guide rollers 3 also serve to prevent the sheets 2 and 6 from becoming wrinkled.

The light-accepting sheet 2 and the image transfer sheet 6, as they remain superposed with each other, are transported to the exposure point P where they are exposed from the side of the base sheet 22 to an image-carrying beam of light reflected from the document on the document table 11. Since this base sheet 22 is light-transmissive, the microcapsules 23 are selectively exposed to light, according to the image carried by the incident light beam. Exposed ones of the microcapsules 23 are hardened as explained above, thereby forming an invisible (latent) image on the base sheet 22. Since the image transfer sheet 6 lying below the light-accepting sheet 2 is generally light-reflective, the incident beam of light passing through the microcapsule-coated layer is reflected back by the image transfer sheet 6 such that the microcapsules 23 are uniformly exposed to light. In other words, the incident beam of light is not wasted but efficiently utilized in hardening the microcapsules 23. Since the sheets 2 and 6 are supported not only between the guide rollers 3 but also from below by the support table 10 at the exposure point P, they are further prevented from becoming wrinkled.

Thereafter, the light-accepting sheet 2 and the image transfer sheet 6 are passed and pressed together between the pressure applying rollers 4. With this pressure, those of the microcapsules 23 not hardened by the exposure to light are ruptured, allowing the colorless dye to flow out thereof and to react chromogenically with the developing agent 62 on the image transfer sheet 6, thereby forming a visible image on the transfer paper. After passing between the pressure applying rollers 4, the light-accepting sheet 2 is wrapped around the take-up roller 5, while the image transfer sheet 6 is pulled by the heat rollers 7 and separated from the light-accepting sheet 2.

As the image transfer sheet 6 passes between the heat rollers 7 now with the visible image formed thereon, the thermoplastic resin thereon becomes soft and covers the surface of the visible image, making it lustrous. Thereafter, the image transfer sheet 6 is discharged onto the discharge tray 9 through the discharge rollers 8. In FIG. 2, numeral 13 indicates a cutter for cutting the image transfer sheets 6 apart before discharging.

Another image formation method embodying the present invention, which is explained in detail below, is characterized as having the aforementioned light-accepting sheet and image transfer sheet already superposed one on top of the other when they are stored. A copier using this method is illustrated in FIG. 4 wherein numeral 30 indicates a light and pressure sensitive image formation sheet (hereinafter referred to simply as image formation sheet) which, as shown in FIGS. 5 and 6, is formed with a light-accepting sheet 2 and an image transfer sheet 6 superposed on top of the other. As broadly explained above by way of FIG. 3, the light-accepting sheet 2 has microcapsules 23 coated on one surface of its base sheet 22 by means of a binder 24 and the image transfer sheet 6 is formed with a base sheet of transfer paper 61 coated with a developing agent 62 and a thermoplastic polymer pigment material (not shown).

Longitudinally along both their side edges, the light-accepting sheet and the image transfer sheet 6 are not coated with the microcapsules 23 or the developing agent 62. Instead, their base sheets 22 and 61 are joined together by an adhesive 65 along these edges. The image formation sheet 30 thus formed is rolled up and stored in the storage case 21 as shown in FIG. 4. In FIG. 6, numerals 30a and 30b show individual layers of the image formation sheet 30 thus rolled up. It is preferable that the adhesive 65 be of a kind that softens at a temperature in the range of (several tens)° C. to (100+several tens)° C. such that the heat rollers 7 with their surface temperature generally maintained in this range serve to make it soft and hence makes it easier to separate the light-accepting sheet 2 and the image transfer sheet 6 apart.

The foregoing description of the invention has been presented for purposes of illustration and description. It is not intended to be exhaustive or to limit the invention to the precise forms disclosed, and many modifications and variations are possible in light of the above teaching. For example the image formation sheet 30 need not be stored in a rolled-up form. FIG. 7 shows another copier adapted to use singly cut image formation sheets 30. It is generally structured like the one shown in FIG. 4 except a supply cassette 71 containing single image formation sheets 30 piled up therein and a feeder roller 73 are provided instead of the storage case 21 such that the single sheets 30 stored in the cassette 71 are sequentially fed from the top by the operation of the feeder roller 73 as done in many prior art copiers.

FIGS. 8 and 9 show light and pressure sensitive image formation sheets 30' and 30" according to other embodiments of the present invention. The sheet 30' shown in FIG. 8 is characterized as having perforated lines 77 in the longitudinal direction inside the edges thereof where the adhesive 65 is applied. This makes it easier to remove the edge sections coated with the adhesive 65 after the image transfer sheet 6 is discharged. The sheet 30" shown in FIG. 9 is characterized as having a narrow strip of area left at an edge outside the adhesive 65 such that the user can easily peel the image transfer sheet 60 off the light-accepting sheet 2.

The adhesive 65 is not always necessary especially when the image formation sheet 30 is used in a rolled-up form as shown in FIG. 4 because if its front end is inserted between the guide rollers 3, the light-accepting sheet 2 and the image transfer sheet 6 stay and are pulled out together. Alternatively, the adhesive 65 may be applied only along one of the edges. When a feeder roller 73 is used as shown in FIG. 7, however, the adhesive 65 is necessary in order to prevent the light-accepting sheet 2 and the image transfer sheet 6 from becoming separated by the frictional force applied by the feeder roller 73.

Any modifications and variations that may be apparent to a person skilled in the art are intended to be included within the scope of this invention.

What is claimed is:

1. An image formation method comprising the steps of
    superposing a light-accepting sheet formed by coating a transparent colorless base sheet with microcapsules encapsulating a colorless dye and a photopolymerizing agent on top of an image transfer sheet coated with a developing agent having a chromagenic effect on said colorless dye, coated surfaces of said sheets contacting each other,
    forming an image on said transparent colorless base sheet by selective hardening of said microcapsules by an image forming beam of light made incident on and through said transparent colorless base sheet of said light-accepting sheet while said light-accepting sheet and said image transfer sheet remain in contact with each other, and
    forming a visible image on said image transfer sheet by applying a pressure on said superposed light-accepting and image transfer sheets together.

2. The method of claim 1 wherein said transparent colorless base sheet comprises polyester.

3. The method of claim 1 wherein said transparent colorless base sheet comprises polyethylene.

4. A supply source of light and pressure sensitive image formation sheet comprising
    a container case,
    a light-accepting sheet with a transparent colorless base sheet having a coating of microcapsules on one surface thereof, said microcapsules encapsulating a photopolymerizing agent and a colorless dye, and
    an image transfer sheet coated with a developing agent on one surface thereof, and developing agent having a chromogenic effect on said colorless dye,
    said light-accepting sheet and said image transfer sheet being superposed one on top of the other to together form an image formation sheet with said coated surfaces contacting each other, and said image formation sheet being contained within said container case.

* * * * *